United States Patent
Schulze et al.

(10) Patent No.: US 8,378,384 B2
(45) Date of Patent: *Feb. 19, 2013

(54) WAFER AND METHOD FOR PRODUCING A WAFER

(75) Inventors: Hans-Joachim Schulze, Ottobrunn (DE); Hans-Joerg Timme, Ottobrunn (DE); Helmut Strack, Munich (DE)

(73) Assignee: Infineon Technologies AG, Neubiberg (DE)

( * ) Notice: Subject to any disclaimer, the term of this patent is extended or adjusted under 35 U.S.C. 154(b) by 824 days.

This patent is subject to a terminal disclaimer.

(21) Appl. No.: 11/864,584

(22) Filed: Sep. 28, 2007

(65) Prior Publication Data

US 2009/0087632 A1 Apr. 2, 2009

(51) Int. Cl.
*H01L 29/66* (2006.01)
*H01L 31/102* (2006.01)
(52) U.S. Cl. .......................... 257/185; 257/191
(58) Field of Classification Search ........... 257/E21.531, 257/E21.119–E21.129, 185, 191
See application file for complete search history.

(56) References Cited

U.S. PATENT DOCUMENTS

| | | | |
|---|---|---|---|
| 4,548,654 A * | 10/1985 | Tobin | 438/471 |
| 4,851,358 A | 7/1989 | Huber | |
| 5,502,331 A * | 3/1996 | Inoue et al. | 257/617 |
| 6,022,793 A | 2/2000 | Wijaranakula et al. | |
| 6,043,516 A | 3/2000 | Schulze | |
| 6,090,689 A | 7/2000 | Sadana et al. | |
| 6,277,501 B1 | 8/2001 | Fujikawa | |
| 6,355,493 B1 * | 3/2002 | Usenko | 438/4 |
| 6,461,933 B2 | 10/2002 | Houston | |
| 6,569,749 B1 | 5/2003 | Wijaranakula et al. | |
| 6,593,173 B1 | 7/2003 | Anc et al. | |
| 7,112,509 B2 | 9/2006 | Erokhin et al. | |
| 7,147,711 B2 * | 12/2006 | Tamatsuka et al. | 117/13 |
| 2002/0157597 A1 * | 10/2002 | Takeno | 117/4 |
| 2003/0013321 A1 * | 1/2003 | Hayamizu et al. | 438/795 |
| 2003/0207044 A1 * | 11/2003 | Sopori | 427/551 |
| 2004/0002200 A1 * | 1/2004 | Koveshnikov | 438/479 |
| 2004/0224477 A1 | 11/2004 | Erokhin et al. | |
| 2005/0026461 A1 * | 2/2005 | Yoneda | 438/795 |
| 2005/0067055 A1 * | 3/2005 | Choe et al. | 148/239 |
| 2005/0088257 A1 * | 4/2005 | Ruby et al. | 333/187 |
| 2006/0075960 A1 * | 4/2006 | Borgini et al. | 117/200 |
| 2008/0246055 A1 | 10/2008 | Schulze et al. | |
| 2009/0051013 A1 * | 2/2009 | Schulze | 257/629 |
| 2009/0087631 A1 * | 4/2009 | Schulze et al. | 428/213 |
| 2009/0305486 A1 | 12/2009 | Schulze et al. | |

FOREIGN PATENT DOCUMENTS

| | | |
|---|---|---|
| DE | 10 2006 002 903 A1 | 8/2007 |
| DE | 697 36 900 T2 | 9/2007 |
| EP | 0 833 388 A2 | 4/1998 |
| EP | 0 948 037 A1 | 10/1999 |

(Continued)

OTHER PUBLICATIONS

Elbrecht, L., et al., "Integration of Bulk Acoustic Wave Filters: Concepts and Trends," IEEE MTT-S Digest, 2004, pp. 395-398.

(Continued)

*Primary Examiner* — James Mitchell
(74) *Attorney, Agent, or Firm* — Slater & Matsil, L.L.P.

(57) ABSTRACT

A wafer includes a wafer frontside surface and a region adjacent to the wafer frontside surface. The region includes oxygen precipitates and the wafer frontside includes a predetermined surface structure to form thereon a device with a desired property.

25 Claims, 6 Drawing Sheets

FOREIGN PATENT DOCUMENTS

| | | |
|---|---|---|
| EP | 1 677 344 A1 | 7/2006 |
| WO | WO 99/21222 | 4/1999 |

OTHER PUBLICATIONS

Ohguro, T., et al. "Improvement of High Resistivity Substrate for Future Mixed Analog-Digital Applications," Symposium on VLSI Technology Digest of Technical Papers, 2002, 2 pages.

Karoui, A., et al., "Role of Nitrogen Related Complexes in the Formation of Defects in Silicon," Applied Physics Letters, American Institute of Physics, Mar. 25, 2002, pp. 2114-2116, vol. 80, No. 12.

Ogura, A., "Formation of Buried Oxide Layer in Si Substrates by Oxygen Precipitation at Implantation Damage of Light Ions," The Japan Society of Applied Physics, Oct. 15, 2001, 3 pages.

Job, R., et al., "Oxygen Gettering on Buried Layers at Post-Implantation Annealing of Hydrogen Implanted Czochralski Silicon," TuDelft, Diffusion and Defect Data, XP008047987, Jan. 1, 1997, pp. 91-96, vol. 57-58.

Falster, R., "Orthogonal Defect Solutions for Silicon Wafers: MDZ and Micro-defect Free Crystal Growth," Process Gases, Chemicals and Materials, Feb. 2, 2002, 240-245, Issue 12, Future FAB International.

Kovacevic, I., et al., "Vacancy-related complexes in neutron-irradiated silicon," Journal of Physics: Condensed Matter, May 20, 2005, pp. S2229-S2235, Institute of Physics Publishing, UK.

Markevich, V.P., "A comparative study of ion implantation and irradiation-induced defects in Ge crystals," Materials Science in Semiconductor Processing, ScienceDirect, 2006, pp. 589-596, Elsevier Ltd.

Markevich, V.P., et al., "Interaction of self-interstitials with oxygen-related defects in electron-irradiated Ge crystals," Materials Science in Semiconductor Processing, ScienceDirect, 2006, pp. 613-618, Elsevier Ltd.

European Search Report, Application No. 08015269.7-1235/2043140, Infineon Technologies AG, Aug. 18, 2009, 8 pages.

Falster, R., et al., "On the Properties of the Intrinsic Point Defects in Silicon: A Perspective from Crystal Growth and Wafer Processing," Apr. 2000, pp. 219-244.

Plummer, J.D., et al., "Silicon VLSI Technology Fundamentals, Practice and Modeling," 2000, 7 pages, Prentice Hall.

* cited by examiner

WAFER AND METHOD FOR PRODUCING A WAFER

BACKGROUND

The present invention relates to a wafer and a method for producing a wafer, and particularly to a high-ohmic substrate with very good stability in its bulk resistivity.

SUMMARY OF THE INVENTION

Embodiments of the present invention provide a wafer comprising a wafer frontside and a region adjacent to the wafer frontside, wherein the region comprises oxygen precipitates and the wafer frontside comprises a predetermined surface structure to form thereon a device with a desired property.

BRIEF DESCRIPTION OF THE DRAWINGS

Embodiments of the present invention will be explained in greater detail in the following with reference to the accompanying drawings, in which.

Before explaining embodiments of the present invention in greater detail in the following on the basis of the drawings, it is pointed out that like elements in the figures are provided with the same or similar reference numerals, and that a repeated description of these elements is omitted.

DETAILED DESCRIPTION OF ILLUSTRATIVE EMBODIMENTS

Figure 1:
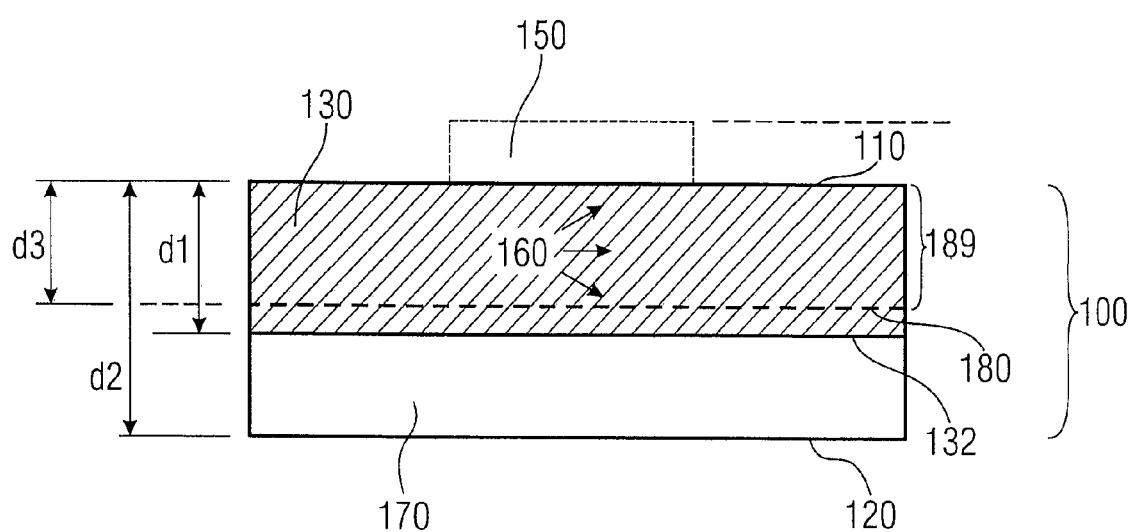
FIG. 1 shows a cross-sectional view of a wafer according to an embodiment of the present invention.

There are devices in which a substrate with very high-ohmic (specific) resistance (measured in $\Omega*cm$) is desirable, namely in particular to minimize current flow to a disc wafer or into the substrate. In particular, a high-frequency performance is limited by passive devices to a great extent by parasitic substrate influences, for example.

Today, technologies for the production of or for the integration of passive high-frequency (RF) devices, such as coils, capacitors or also resonators, are available on the basis of modern semiconductor planar technology and are increasingly gaining importance. For achieving reasonable RF performance, insulating, semi-insulating or at least very high-ohmic substrates are desirable. For example, a glass carrier may be employed as an insulating substrate, and gallium arsenide (GaAs) is one example for semi-insulating substrates. Low-doped silicon wafers, on the other hand, are available as high-ohmic substrates, with typical resistivities of 200 $\Omega*cm$ or more. In order to achieve a resistivity of, say, 1000 $\Omega*cm$, n-type silicon wafers need a dopant density of around $4.2\times10^{12}$ $cm^{-3}$, whereas p-type silicon wafers need a dopant density of around $1.3\times10^{13}$ $cm^{-3}$.

When using, for example, high-ohmic silicon substrates, a principle technical problem results, which consists in the fact that the doping may change depending on the respective fabrication process, and having a high resistivity (high-ohmic resistance) hence is not a stable (process-invariant) property of the wafers. For example, oxygen complexes—so-called thermal donors (TDs)—may be created in significant concentrations. Interstitial oxygen comprises the major source for the complexes resulting in thermal donors. For example, maximum thermal donor concentrations can reach $3\times10^{16}$ $cm^{-3}$ after 450° C. annealing of (CZ) silicon with interstitial oxygen concentration of about $1\times10^{18}$ $cm^{-3}$. If annealed at 450° C. for one hour only, a TD concentration of ca. $2\times10^{15}$ $cm^{-3}$ has been reported. It is obvious that thermal donors created in such concentrations will completely alter the resistivity of an initially low-doped silicon wafer, because the TDs become the dominant dopant. For low-doped n-type wafers, TDs always decrease the resistivity. For low-doped p-type wafers, sufficiently small TD concentrations will compensate or slightly overcompensate the initial p-type doping, resulting in an increased resistivity. For higher TD concentrations, however, TDs will decrease resistivity, because the wafer has become n-type. RF-device wafers thus processed may finally be on a low-ohmic (n-doped) silicon substrate (wafer) at the end of the process. As a consequence, the RF device suffers from a substantial deterioration of its RF performance. Such performance losses may lead to violations of the chip or product specification and correspondingly to production yield losses.

Previously, for the above-described applications in the 150 mm fabrication (6"), so-called float zone silicon wafers (FZ-wafers) have been used. Due to the production method, FZ-wafers only have a very low concentration of interstitial oxygen, whereby thermal donors cannot be formed in any significant concentration. As a consequence, high-ohmic low-doped p-type or n-type FZ-silicon material maintains its resistivity.

For the 200 mm fabrication (8"), however, FZ-wafers are hardly available. The available Czochralski wafer material (CZ-wafer) comprises significantly higher concentrations of interstitial oxygen for production reasons and typical concentrations may range from $3\times10^{17}$ to about $10^{18}$ $cm^{-3}$ or from $5\times10^{17}$ to $7\times10^{17}$ $cm^{-3}$. Such high interstitial oxygen concentrations, depending on the respective process for wafer production, may lead to significant generation of thermal donors, and correspondingly to reduced or insufficient performance of the resulting RF-devices. Corresponding effects are observed in various technologies.

Conventional approaches to prevent or to solve the described problem are:

(1) use of p-type CZ-wafers with higher dopant concentrations (and thus smaller resistivity) by taking advantage of compensation effects, or (2) reduction of the thermal budget (length and intensity of a thermal treatment) while avoiding, if possible, the especially critical process temperatures around 450° C., or (3) use of additional tempering steps at higher temperatures—e.g., RTA (rapid thermal annealing) around 900° C.—for the (partial) annihilation of thermal donors already generated, or also (4) falling back on FZ-wafer material.

Disadvantages of the conventional approaches to a solution or methods described can be summarized as follows:

(with reference to 1) Both the substrate doping and the ohmic property in connection therewith and the concentration of the thermal donors generated are subject to strong fluctuations. In particular, the formation rate of the thermal donors sensitively depends on influencing factors, such as the interstitial oxygen concentration, or the concentration of hydrogen or carbon, etc. Thus, there is the risk of insufficient or also overdosed compensation of an initial p-type (boron-doped)

substrate. In both cases, a substrate that is too low-ohmic will be generated. The corresponding process window is very small and may not even be present in the case of a strong formation of thermal donors.

(with reference to 2) The thermal budgets of the individual processes used can be modified only within certain limits, because the process temperatures influence a great number of process, layer and device properties. Moreover, the temperature influence is also subject to other factors, such as, for example, the present interstitial oxygen concentration.

(with reference to 3) Destruction of thermal donors needs high-temperature annealing. Such an annealing can, however, not take place at the end of the process, because certain materials (such as, for example, metals like aluminum) can only cope with moderate temperatures up to about 400° C. Thereby, the destruction of thermal donors should be performed somewhere in the middle of the production process, more precisely prior to the so-called back-end-of-line (BEOL) processing steps, and thus is necessarily incomplete, as new TD may be created afterwards.

(with reference to 4) FZ-grown silicon wafers having 200 mm diameters are hardly available at present and are much more expensive than standard CZ-grown 200 mm silicon wafers.

Embodiments of the present invention provide a wafer comprising a region below a wafer surface and the region comprises oxygen precipitates. The oxygen precipitates comprise, for example, oxygen enriched clusters. Thus, according to embodiments, a high density of oxygen precipitates is created in a high-ohmic, but oxygen-rich, CZ material in a targeted manner, to thereby avoid the named disadvantages of conventional wafers and to obtain a substrate with very good stability and high impedance—the specific resistivity, in particular, hardly changes under temperature influences. The interstitial oxygen concentration [Oi] in a common CZ-wafer ranges from 6 to $10\times10^{17}$ $cm^{-3}$, for example, and this interstitial oxygen concentration [Oi] is significantly reduced by the consumption of interstitial oxygen caused by the proposed generation and growth of oxygen precipitates. As a consequence, the formation of thermal donors is suppressed strongly. This is possible because the formation of thermal donors sensitively depends on the interstitial oxygen concentration [Oi] at some power of 3.5+/−1.0.

According to the present embodiments, oxygen precipitation may, for example, be realized by means of proton irradiation. The proton irradiation may take place right at the beginning of the device processing on the wafer front side of the starting material, i.e., that side of the wafer on which devices will be formed in ensuing processes, and results in a high vacancy density being created in the lattice structure of the wafer. The high vacancy density leads to a promotion of the precipitation processes in the irradiated wafer area. The proton irradiation thus causes or promotes a high precipitate density. The precipitate density may be at least $10^{17}/cm^3$ or higher.

It is, for example, possible to use a proton irradiation from the wafer backside to achieve a zone below the wafer backside with very good getter properties for heavy-metal contamination and for vacancies, and to achieve a "denuded zone", which is liberated from oxygen precipitates and heavy-metal contaminations, on the other wafer side (below the wafer front side). For example, in this "denuded zone" active electrical devices can also be implemented. In ensuing processes, the zone that has been exposed to the proton irradiation (getter zone) may finally be removed again by grinding, etching or polishing.

According to embodiments of the present invention, however, the purity of the silicon wafer is of subordinate importance, and embodiments instead aim at a reduction of the concentration of thermal donors with the aid of the oxygen precipitates created in a targeted manner. For this reason, in embodiments, the irradiated wafer side is especially interesting for the formation of RF-devices. For the devices described, hence, it is desirable to keep the wafer bulk volume with the high precipitate density instead of grinding and etching it away by means of the wafer thinning process. To this end, it is advantageous to adjust the energy of the front-side proton irradiation so that the so-called end-of-range area of this irradiation lies in a depth (e.g., the penetration depth) approximately corresponding to the target thickness of the substrate for the device after thinning. For example, the depth may be at least 10% or 50% of the wafer thickness. The penetration depth of the protons may, however, also be chosen slightly smaller than the targeted final thickness (desired substrate thickness). The precipitate-free wafer volume, i.e., that part of the wafer in which no precipitates have formed as a result of the proton irradiation, is removed by grinding/etching at the end of the production process. Thus, the substrate of the finally processed device generally comprises precipitates across the entire layer thickness and hence offers a high-ohmic underground, e.g., for the RF device.

Since typical thicknesses of the above-described finished wafers (i.e., thinned wafers) lie at about 150 µm, a proton energy of about 3 to 4 MeV, for example, is suited for this. Typical proton dosages (a proton concentration in protons per area unit irradiated) suited for achieving the desired effect range from $10^{13}$ to $10^{15}$ protons per $cm^2$ or from several $10^{13}$ to several $10^{14}$ protons per $cm^2$.

After performing the proton implantation at the front side (on which the later devices can be formed) of the initial wafer, preferably an additional annealing/tempering step may still be performed, which promotes the formation of precipitates. A typical high-temperature process suited for this may be designed as follows, for example. At first, annealing over several hours (e.g., 5 hours) at temperatures ranging from 650° C. to 900° C. or from 750° C. to 850° C., for example, takes place. This annealing is performed, e.g., in an inert atmosphere (for example, comprising nitrogen or a noble gas) or in a weakly oxidizing atmosphere when the formation of precipitation seeds takes place. Then, a further tempering step may be performed, which may again take place, e.g., in an inert atmosphere or weakly oxidizing atmosphere at temperatures ranging from 900° C. to 1150° C. or from 950° C. to 1050° C., for example. By doing this, the growth of the precipitation seeds results in sufficiently large and stable oxygen precipitates. Further promotion of the precipitate formation may be achieved by adding a chlorine-containing compound, such as hydrogen chloride (HCl), to the gas atmosphere during a tempering step, since thereby the vacancy concentration in the semiconductor crystal can additionally be increased.

Embodiments of the present invention thus utilize the effect of the generation of oxygen precipitates in the front-side area of the high-ohmic basic material (wafer) in a targeted manner, in order to reduce the interstitial oxygen concentration [Oi]. This results in a suppression of the generation of so-called thermal donors in the course of the device processing, and thus prevents the layer resistivity from decreasing during the device processing.

Embodiments of the present invention, and particularly the high density of oxygen precipitates, entail several advantages—with respect to the above-mentioned conventional devices. As a first advantage, the charge carriers have a significantly lower mean free-path length and thus are subject to significantly increased substrate resistance. In comparison with conventional substrates, moreover, temperature dependence of the resistivity decreases significantly. Furthermore, it is advantageous that oxygen-induced thermal donors can be avoided or at least significantly reduced, because a great proportion of the interstitial oxygen atoms has been used up in the generated precipitates. Finally, it is advantageous that reflections of photons at the wafer backside (opposite to the formed RF device on the wafer front side) can be avoided by pronounced scatterings of photons at the oxygen precipitates.

FIG. 1 shows a cross-sectional view through a wafer 100, which comprises a wafer surface (wafer frontside) 110 and a further surface (wafer backside) 120, wherein a region (high-precipitate-density region) 130 is arranged along the device surface 110. The high-precipitate-density region 130 comprises a mean layer thickness d1, and the wafer 100 comprises a wafer layer thickness d2. The wafer surface 110 is formed so that a device 150 can be arranged on the wafer surface 110 in a following processing. The wafer surface 110 may, for example, additionally be smoothened or polished, so that it comprises a highly planar surface, whereas the further surface 120 may not be treated during the process of manufacturing the wafer 100. In this sense, the wafer surface 110 designates the frontside, and the further surface 120 the backside, of the wafer 100. Hence, the wafer frontside 110 is the surface on which the device 150 is formed.

According to embodiments, the high-precipitate-density region 130 comprises oxygen precipitates 160. The wafer layer thickness d2 may differ from the mean layer thickness d1 of the high-precipitate-density region 130, so that the wafer 100 comprises a low-precipitate-density region 170, which is arranged between the further surface 120 of the wafer 100 and the high-precipitate-density region 130. An interface 132 may separate the high- and low-precipitate-density regions 130, 170. The low-precipitate-density region 170 may, for example, be removed or thinned again after a processing of the device 150 to obtain a final wafer 189 with a thickness d3 (indicated by a dashed line 180 in FIG. 1), so that the substrate for the device 150 is formed by the high-precipitate-density region 130 or by parts of the high-precipitate-density region 130.

In further embodiments, the final wafer thickness or final layer thickness d3 is bigger than the mean layer thickness d1, which is especially possible if the low-precipitate-density region 170 comprises a specific resistance (after the thermal annealing), which is high enough to ensure a proper operation of the device 150 with desired specifications, e.g., if the specific resistance comprises at least a value of 100 Ω*cm.

The high-precipitate-density region 130 may, for example, be generated by proton irradiation with predetermined energy, wherein the predetermined energy is chosen so as to achieve a desired value for the mean layer thickness d1. The desired value for the mean layer thickness d1 may, for example, be chosen corresponding to a desired layer thickness of the substrate 100 for the finished device 150. The mean layer thickness d1 may, for example, comprise more than 30%, at least 60% or at least 90% of the wafer layer thickness d2. It is also possible that the mean layer thickness d1 matches the wafer layer thickness d2. This is the case if the energy of the proton radiation is chosen such that the penetration depth of the end of range of the implanted protons corresponds to the wafer thickness d2 so that oxygen precipitates 160 form across the entire wafer thickness d2. This may further be achieved by options like using a sufficiently thin starting wafer, or using some sufficiently large mean layer thickness of the region, or by removing sufficient material from the backside of the wafer during a thinning process.

Concerning a dose of protons for the irradiation, an exemplary value may be chosen to be within the range from $10^{13}$ to $10^{15}$ protons per cm$^2$. The dose of the proton irradiation may, for example, be adapted to a concentration of the interstitial oxygen in the substrate crystal—e.g., the more interstitial oxygen present, the higher the proton dose that may be chosen. This (interstitial) oxygen (attached, e.g., at voids) can act after all as a source for thermal donors later—at least after thermal activation if they are not removed or deactivated, e.g., by the described precipitation. For the target application in which the substrate 100 acts only as support of the device 150, the change in the crystal structure (additional voids) due to the irradiation is not disadvantageous—in contrast the precipitates change acoustic properties of the wafer 100 in a desirable way (suppression of unwanted reflections of acoustic waves, for example).

Figure 2:
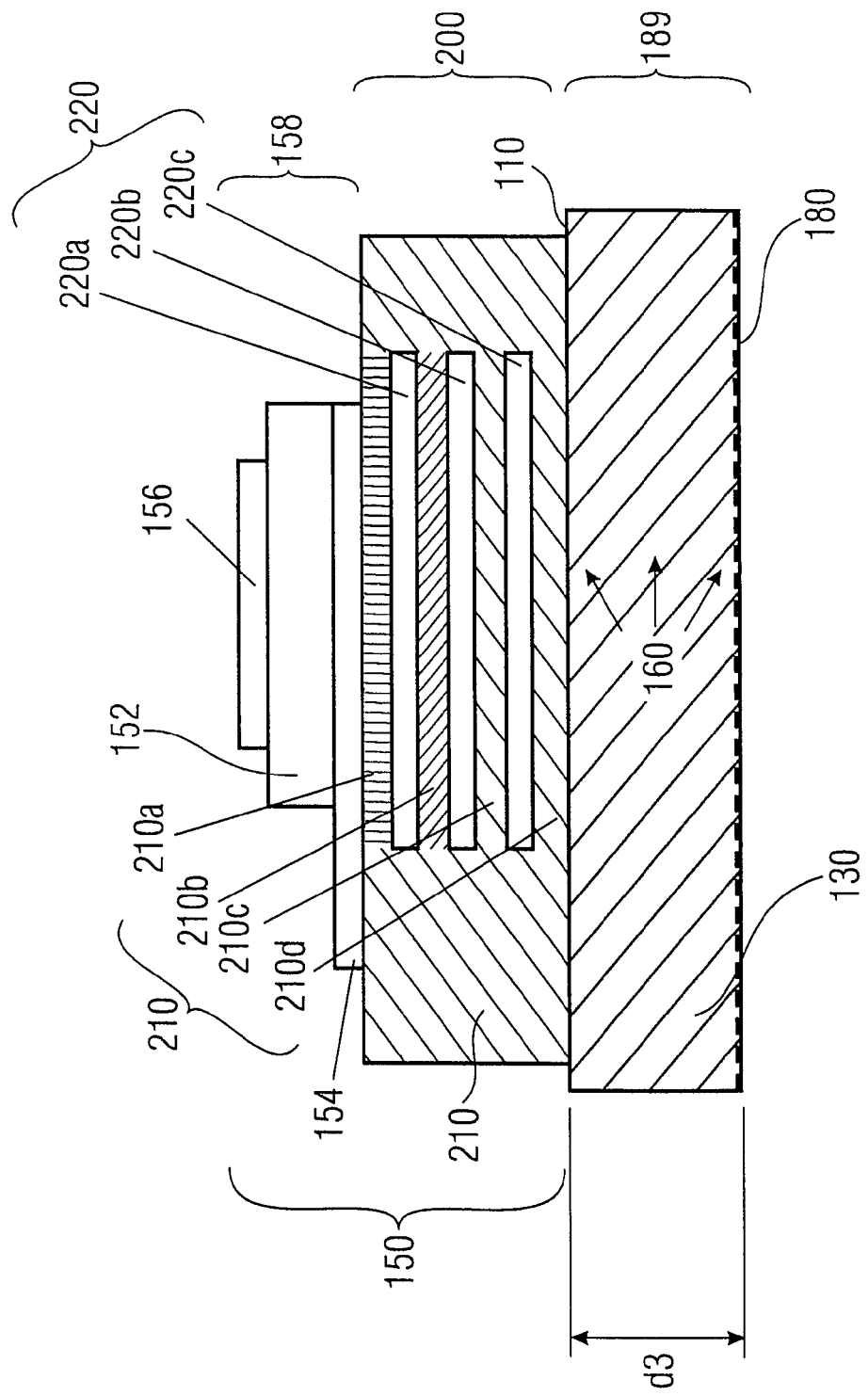
FIG. 2 shows a cross-sectional view of a wafer with a BAW device formed thereon.

FIG. 2 shows the final wafer 189 with the processed device 150, which utilizes the region 130 with the oxygen precipitates 160 (which is also denoted a high-precipitate-density region) as a substrate thinned to the thickness d3 (or to the dashed line 180 in FIG. 1). In the embodiment shown in FIG. 2, the device 150 comprises a BAW (bulk acoustic wave) resonator 158 without an acoustic decoupling structure and an acoustic mirror 200 as an example for an acoustic decoupling structure. The BAW resonator 158 comprises a piezoelectric layer 152 sandwiched between a first electrode 154 (bottom electrode) and a second electrode 156 (top electrode). Between the first electrode 154 and the high-precipitate-density region 130, the acoustic mirror 200 is formed, wherein the acoustic mirror 200 comprises an alternating layer sequence of materials with high acoustic impedance 220 and low acoustic impedance 210. In the embodiment shown, the acoustic mirror 200 comprises three layers with high acoustic impedance, the layers 220a to 220c, each separated by one layer with low acoustic impedance 210. The layers with high acoustic impedance 220 may also be completely embedded into layers (or material) with low acoustic impedances 210a-210d.

The BAW resonator 150 shown in FIG. 2 as one embodiment finds application in so-called BAW filters, for example, which in turn are applied particularly in mobile cellular communications. The BAW resonators typically resonate at frequencies around 1 to 2 GHz and as high-frequency devices rely on loss-free, high-ohmic substrates. BAW resonators or BAW-filters typically are designed as passive devices and do not need pn-junctions. Correspondingly, the substrate only serves as a carrier, and a so-called "denuded zone" with highly pure silicon, into which a high-quality pn-junction may be formed, is not needed for this reason. In order to obtain a BAW resonator 150 with desired properties (e.g., attenuation for an input signal) it is important that the device surface 110 comprises a predetermined surface structure (e.g., a polished or a planar surface).

The high-ohmic substrate according to embodiments may also serve as carrier/underground for other BAW devices (or other high-frequency devices) or for other passive RF devices like capacitors or coils. The BAW resonator 150 as simplest example, only comprises one bottom electrode (first electrode 154), the piezoelectric layer 152 and one top electrode (second electrode 156). The acoustic mirror 200 serves for acoustic decoupling of the vibrating BAW resonator 150 from the region 130 and for example provides for acoustic waves being prevented from propagation into the substrate. As mentioned above, the acoustic mirror 200 for this purpose typically comprises a sequence of layers with alternating high and low acoustic impedance (high Z and low Z), wherein the layer sequence may, for example, be designed as a λ/4 absorber by choosing the layer thickness correspondingly. An example for a material with high acoustic impedance is tungsten, and silicon oxide may be used as the material with low acoustic impedance.

The BAW resonator 150 may be arranged on a common substrate 130 together with other resonators. For avoiding parasitic losses, the substrate 130 should therefore be insulating, semi-insulating or very high-ohmic. Silicon substrates with a resistivity of at least 500 Ω*cm are typical in these applications, but a resistivity ranging from about 2 kΩ*cm to 4 kΩ*cm is preferred.

It is understood that the piezo-electric layer 152 can comprise one or more different layers, of which at least one exhibits piezo-electric activity. The other layers between the top and bottom electrodes 156 and 154 can be non-piezo-active dielectric or other layers to achieve special performance effects like temperature coefficient compensation or to facilitate manufacturing, such as adhesion layers. In addition, the other layers are typically thin when compared to "real" piezoelectric layer. It is also understood that the bottom and top electrode layers 154 and 156 can comprise one or more different layers. For example, the top electrode 156 can include a passivation layer, and both electrodes 154 and 156 may be composed of several layers with different conductive materials each.

For the acoustic mirror 200, possible materials for layers with high acoustic impedance comprise, for example: W, Mo, Pt, Ta, TiW, TiN, Ir, WSi, Au, $Al_2O_3$, SiN, $Ta_2O_5$ and Zirkonoxide, wherein the last four are dielectric materials. Possible materials for the piezoelectric layers are, for example, AlN, ZnO, and PZT. A material for lower acoustic impedance is, for example, aluminum.

Figure 3:
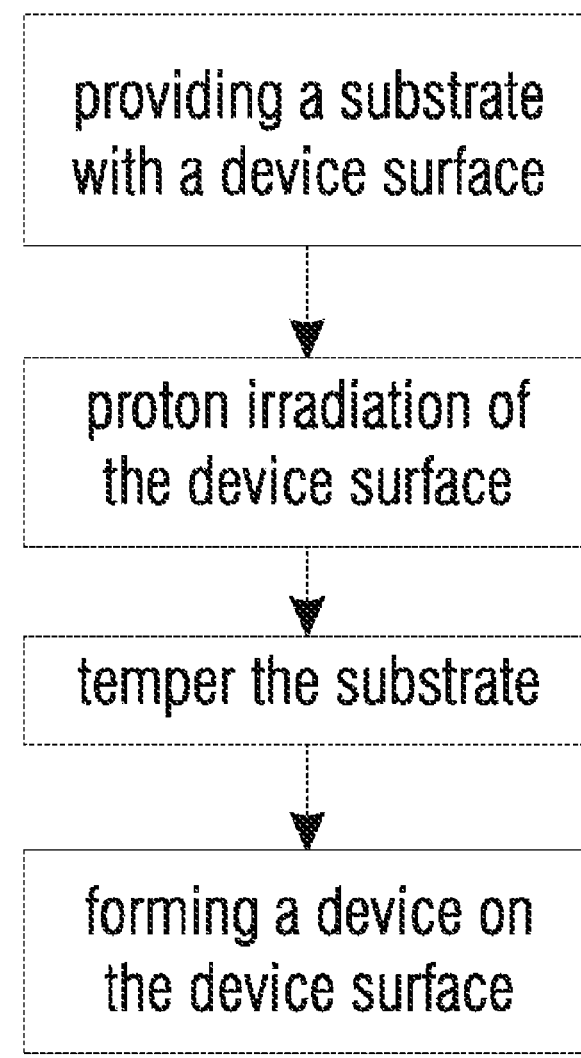
FIG. 3 shows a sequence of steps for producing a wafer according to another embodiment.

FIG. 3 shows a schematic step sequence for a method for producing a substrate. To this end, at first a substrate with a device surface is provided, and subsequently the surface is subjected to proton irradiation. An ensuing tempering step of the substrate is executed with the aim that precipitation seeds form in the substrate. These precipitation seeds grow to oxygen precipitates in the following tempering step, i.e., the interstitial oxygen attaches to the precipitation seeds. The first of the two tempering steps may, for example, comprise a temperature of about 750° C. to about 850° C. for a duration ranging, for example, between 2 and 10 hours, and the second tempering step a temperature of about 950° C. to about 1050° C. A tempering duration may, for example, be about 10 to about 30 hours.

Subsequently, the device may be formed on the device surface, and the substrate with the oxygen precipitates thus serves as a high-ohmic carrier particularly suited for RF devices. Optionally, the layer sequence may be expanded in that, prior to forming the device, a planarization or polishing step is performed on the device surface, so that a highly planar surface forms, which may, for example, be a basis for a bottom electrode or an acoustic mirror of a BAW device.

FIGS. 4A-4D show a typical process flow for manufacturing a device 150 on a high-ohmic substrate built from a high-precipitate-density region 130.

Figure 4A:
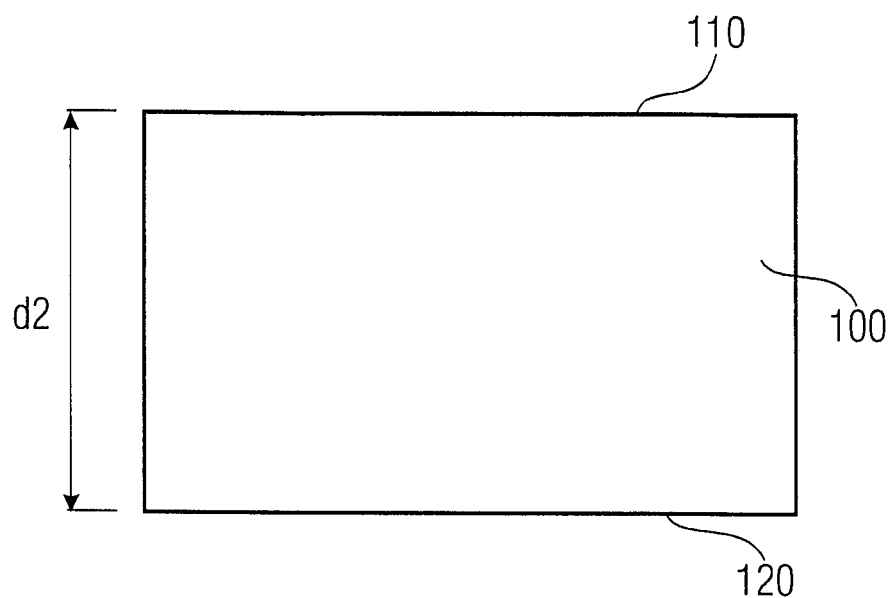
FIGS. 4A to 4D show a typical process flow for processing a wafer with a device.

FIG. 4A shows an original wafer substrate 100 with a wafer frontside 110 and a wafer backside 120, comprising a wafer layer thickness d2.

Figure 4B:
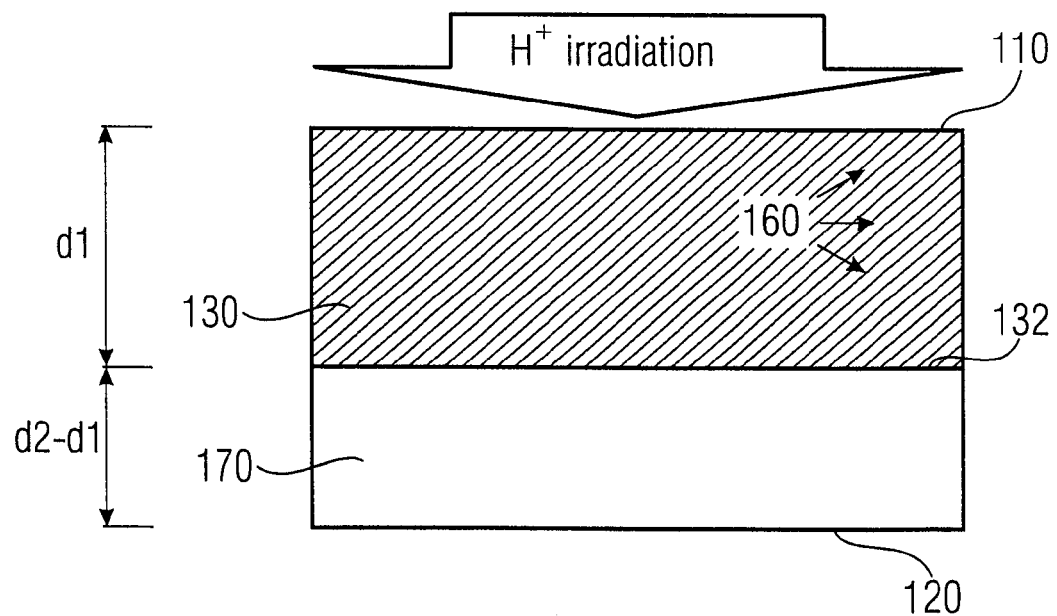

FIG. 4B shows the wafer 100 after proton irradiation (H+-irradiation) of the wafer frontside 110 and the annealing to generate precipitates 160 in high-precipitate-density region 130, which comprises mean layer thickness d1. The high-precipitate-density region 130 is separated from low-precipitate-density region 170 by interface 132. The low-precipitate-density region 170 extends to the wafer backside 120 and comprises a mean layer thickness of d2−d1.

Figure 4C:
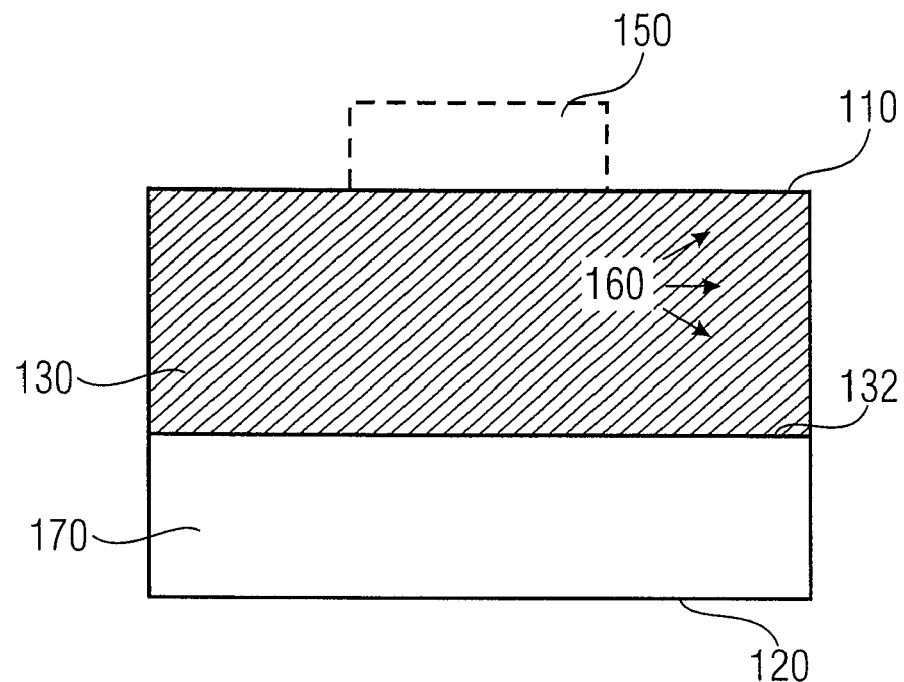

FIG. 4C shows as the next step, the processing of the device 150 on the wafer frontside 110, so that the high-precipitate-density region 130 with the exemplary oxygen precipitates 160 serves as the substrate for the device 150.

Figure 4D:
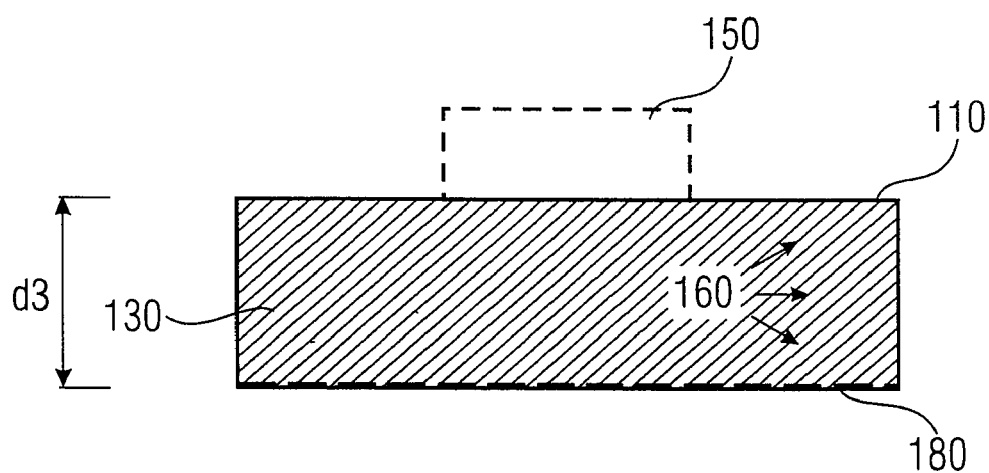

FIG. 4D shows as an optional last step, a thinning to the backside surface 180 (see FIG. 1) at the end of the process, which comprises a final wafer thickness d3. The thinning can, for example, be performed by a backside grinding and/or etching step and the final wafer thickness d3 at the end of processing is preferably smaller than the mean layer thickness d1 of the high-precipitate-density region 130 (or is of approximately the same value as d1 or +/−30% of it). Therefore, in preferred embodiments the thicknesses can fulfill the relations: 0<d1<d2 and 0<d3<d2, wherein d3<d1 (e.g., d3 can be at least 50 or at least 90% of d1), or d3 is at least approximately equal to d1.

Figure 5:
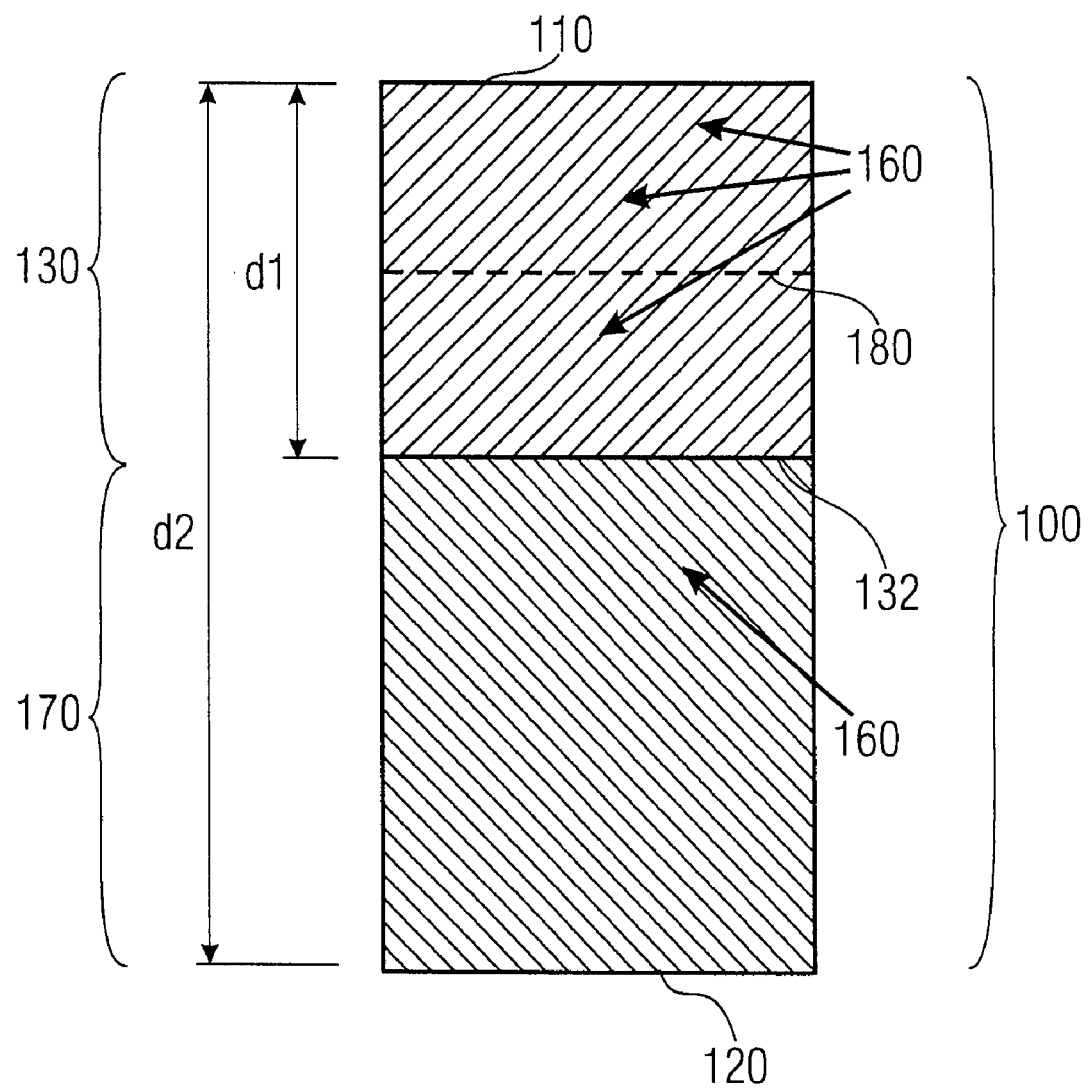
FIG. 5 shows a depiction of a cross-sectional view of a wafer with visible defects.

FIG. 5 shows a picture of a typical cross section of the wafer 100 of thickness d2 after defect etching, which has formed precipitates 160 below the wafer frontside (device surface 110) in the high-precipitate-density region 130 as a result of irradiation (e.g., by protons) and corresponding tempering. It is clearly recognizable that the high-precipitate-density region 130 with an extremely high density of oxygen precipitates 160 has formed in the irradiated area up to the interface 132 with the mean layer thickness d1. In this sample, an oxygen-rich CZ-wafer or a CZ sample correspondingly irradiated with protons and tempered served as starting material. As a consequence, bulk micro defects (BMD) and stacking faults (SF) have formed, wherein bulk micro defects or precipitates, respectively, only sparsely occur in the low-precipitate-density region 170. In the high-precipitate-density region 130, the bulk micro defects and the stacking faults finally occur in extremely high density due to the proton/vacancy-induced formation of oxygen precipitates upon annealing after the irradiation. This latter area, i.e., the high-precipitate-density region 130, comprises the high electrical resistance, the value of which does not change or hardly changes in following processing steps—since thermal donors are no longer or are hardly present because of a significant reduced interstitial oxygen concentration. Since the substrate 100 serves as a carrier for RF-devices for the desired application, the presence of oxygen precipitates and the silicon defects connected therewith are not disadvantageous.

The mean thickness d1 of the high-precipitate-density region 130 can, for example, comprise approximately 300 μm, and the wafer thickness d2 can comprise approximately 700 μm or 725 μm (for example, for a typical 200 mm wafer). The final wafer thickness d3 (after the thinning to the dashed line 180) can, for example, comprise a value of approximately 150 μm. These values for thicknesses d1, d2 and d3 can of course differ in other embodiments and can depend especially on the desired specification for the device 150 and/or the mechanical stability of the substrate in conjunction with a desired specific resistivity. Also the device 150 can be any other device (e.g., other RF-devices), for which a high-ohmic substrate is desirable—the BAW resonator 158 served only an example.

In further embodiments, the wafer 100 comprises instead of silicon another material, e.g., another semiconductor. Also the number and size of the precipitates can differ, dependent on the wafer material and on the manufacturing process. In addition, the amount of oxygen in the precipitates may differ—more than 50%, more than 80% or more than 90% of the total amount of oxygen being in the wafer. The precipitates can also comprise other chemical elements—not only oxygen. It is moreover possible instead of protons to use other isotopes of hydrogen (e.g., deuterium) or other particles or atoms.

Embodiments concern a wafer in which the predetermined surface structure of the wafer frontside comprises a planar and/or polished surface. The region with oxygen precipitates may extend across the wafer.

Embodiments concern a BAW device comprising an acoustic mirror formed between the region and the first electrode, wherein the acoustic mirror comprises an alternating layer sequence of materials with high and low acoustic impedance. The acoustic mirror may comprise tungsten as a material with high acoustic impedance and silicon oxide as a material with low acoustic impedance. The substrate may comprise a substrate layer thickness and the region may comprise a mean layer thickness, wherein the mean layer thickness may comprise at least 90% of a substrate layer thickness. The region with oxygen precipitates may extend across the entire substrate layer thickness.

Embodiments concern a BAW device comprising means for supporting the device such that a vibration within the means for BAW filtering is substantially not hindered.

Embodiments concern a method for producing a wafer wherein forming the region may comprise a step of polishing and/or smoothing the surface. Forming the region may comprise a proton or deuterium irradiation, wherein the irradiation by protons may comprise protons comprising an energy within a range from 1 MeV to 10 MeV. The proton concentration may be within a range from $10^{13}$ to $10^{15}$ protons per cm$^2$. The method may further comprise grinding and/or an etching the substrate for thinning the same. The step of tempering may comprise a first tempering phase for a first time interval at a first temperature and a second tempering phase for a second time interval at a second temperature, wherein the first and second temperatures are different. The first temperature may comprise a value within a first range between about 650° C. and about 900° C., and the second temperature may comprise a value within a second range from about 900° C. to about 1150° C. The method may comprise a tempering step. The step of tempering may be executed in the presence of a chlorine-comprising compound so that a vacancy concentration in the substrate is increased, or in the presence of hydrogen chloride.

What is claimed is:
1. A wafer, comprising:
   a wafer frontside with a predetermined surface structure, to form thereon a device with a desired property; and
   a high-oxygen-precipitate-density region with oxygen precipitates and a low-oxygen-precipitate-density region with oxygen precipitates, the high-oxygen-precipitate-density region extending from the wafer frontside into the wafer and disposed between the wafer frontside and the low-oxygen-precipitate-density region.
2. The wafer of claim 1, wherein the device comprises a BAW resonator or a BAW filter or other passive RF devices.
3. The wafer of claim 1, wherein the oxygen precipitates in the high-oxygen-precipitate-density region are formed in a vacancy-rich region, wherein the vacancy-rich region is formed by proton or deuterium irradiation.
4. The wafer of claim 1, wherein the wafer comprises a wafer thickness and the high-oxygen-precipitate-density region with oxygen precipitates comprises a mean layer thickness,
   wherein the mean layer thickness comprises at least 10% of the wafer thickness.
5. The wafer of claim 1, wherein the high-oxygen-precipitate-density region comprises a mean layer thickness within a range from about 100 μm to about 300 μm.
6. The wafer of claim 1, wherein the low-oxygen-precipitate-density region with oxygen precipitates is removed so that the high-oxygen-precipitate-density region extends across the wafer.
7. The wafer of claim 1, wherein the high-oxygen-precipitate-density region comprises a specific resistivity of at least 200 Ω*cm.
8. The wafer of claim 1, wherein a number and/or a size of the oxygen precipitates are such that a specific resistivity of the high-oxygen-precipitate-density region with oxygen precipitates maintains at least a value of 200 Ω*cm during an annealing process at a temperature between 400° C. and 500° C.
9. The wafer of claim 1, wherein the oxygen precipitates consume at least 80% of interstitial oxygen of the region.
10. The wafer of claim 1, wherein a density of the oxygen precipitates in the high-oxygen-precipitate-density region is at least $10^{17}$/cm$^3$ or higher.
11. An apparatus, comprising:
    a substrate with a surface, the substrate comprising a high-oxygen-precipitate-density region with oxygen precipitates and a low-oxygen-precipitate-density region with oxygen precipitates, wherein the high-oxygen-precipitate-density region with oxygen precipitates extends from the surface into the substrate and wherein the high-oxygen-precipitate-density region is disposed between the surface of the substrate and the low-oxygen-precipitate-density region; and
    a device formed on the surface.
12. The apparatus of claim 11, wherein the device comprises a bulk acoustic wave (BAW) device, comprising:
    a first electrode formed at least partially along the surface, wherein an acoustic decoupling structure is provided between the first electrode and the surface of the substrate;
    a piezoelectric layer formed at least partially on the first electrode; and
    a second electrode formed at least partially on the piezoelectric layer.
13. The apparatus of claim 11, wherein a number and/or a size of the oxygen precipitates in the high-oxygen-precipitate-density region are such that a specific resistivity of the region with oxygen precipitates maintains at least a value of 200 Ω*cm during an annealing process at a temperature between 400° C. and 500° C.
14. An apparatus, comprising:
    means for supporting a device, the means for supporting comprising a surface supporting the device, a high-oxygen-precipitate-density region with oxygen precipitates and a low-oxygen-precipitate-density region with oxygen precipitates; and
    means for electrically insulating the device,
    wherein the means for electrically insulating is formed by the high-oxygen-precipitate-density region with oxygen precipitates, wherein the high-oxygen-precipitate-density region extends from the surface into the means for supporting, and wherein the high-oxygen-precipitate-density region is disposed between the surface and the low-oxygen-precipitate-density region.
15. A method for producing a wafer, the method comprising:
    providing a substrate comprising a surface, the surface comprising a surface structure to form thereon a device comprising a desired property; and forming in the substrate a high-oxygen-precipitate-density region with oxygen precipitates and a low-oxygen-precipitate-density region with oxygen precipitates, wherein the high oxygen-precipitate-density region is formed adjacent the surface so as to extend from the surface into the substrate, and wherein the high-oxygen-precipitate-density region is disposed between the surface of the substrate and the low-oxygen-precipitate-density region.

16. The method of claim 15, wherein the device comprises a BAW resonator formed on the surface, and providing the substrate is performed such that the BAW resonator comprises a predetermined resonator frequency.

17. The method of claim 15, wherein forming the region comprises proton or deuterium irradiation of the surface to generate vacancies in a crystal lattice structure of the substrate.

18. The method of claim 17, wherein the proton irradiation is executed such that protons have a penetration depth, wherein the penetration depth comprises at least 10% of a layer thickness of the substrate.

19. The method of claim 17, wherein the proton irradiation comprises a proton concentration within a range from $10^{13}$ to $10^{15}$ protons per $cm^2$.

20. The method of claim 15, further comprising thinning such that the substrate comprises a thinned surface layer thickness, the region comprising a mean layer thickness comprising at least 60% of the thinned surface layer thickness.

21. The method of claim 15, further comprising performing a tempering step at temperatures between about 750° C. and about 1050° C. to form oxygen precipitates.

22. The method of claim 15, wherein forming in the substrate a high-oxygen-precipitate-density region with oxygen precipitates and a low-oxygen-precipitate-density region with oxygen precipitates comprises proton or deuterium irradiation of the surface to generate vacancies in a crystal lattice structure of the substrate.

23. The method of claim 15, further comprising partly or completely removing the low-oxygen-precipitate-density region with oxygen precipitates.

24. A wafer comprising:
a wafer frontside with a predetermined surface structure to form thereon a device with a desired property; and
a high-precipitate-density region with oxygen precipitates and a low-oxygen-precipitate-density region with oxygen precipitates, the high-precipitate-density region extending from the wafer frontside into the wafer, wherein the dimension of the high-precipitate-density region is defined by a proton irradiation preceding a tempering of the wafer, and wherein the high-oxygen-precipitate-density region is disposed between the wafer frontside and the low-oxygen-precipitate-density region.

25. An apparatus, comprising:
a substrate with a surface, the surface comprising a high-precipitate-density region with oxygen precipitates and a low-oxygen-precipitate-density region with oxygen precipitates, the high-precipitate-density region extending from the surface into the substrate, and wherein the high-oxygen-precipitate-density region is disposed between the surface of the substrate and the low-oxygen-precipitate-density region; and
a device formed on the surface, wherein the dimension of the high-precipitate-density region is defined by a proton irradiation preceding a tempering of the substrate.

* * * * *